United States Patent
Shinozaki et al.

(10) Patent No.: US 7,942,971 B2
(45) Date of Patent: May 17, 2011

(54) METHOD OF MANUFACTURING PLASMA DISPLAY PANELS

(75) Inventors: Jun Shinozaki, Kyotanabe (JP); Michihiko Takase, Ikoma (JP); Hiroyuki Furukawa, Takatsuki (JP)

(73) Assignee: Panasonic Corporation, Osaka (JP)

( * ) Notice: Subject to any disclaimer, the term of this patent is extended or adjusted under 35 U.S.C. 154(b) by 236 days.

(21) Appl. No.: 10/522,059

(22) PCT Filed: Apr. 5, 2004

(86) PCT No.: PCT/JP2004/004901
§ 371 (c)(1),
(2), (4) Date: Jan. 20, 2005

(87) PCT Pub. No.: WO2004/090928
PCT Pub. Date: Oct. 21, 2004

(65) Prior Publication Data
US 2006/0068084 A1    Mar. 30, 2006

(30) Foreign Application Priority Data

Apr. 4, 2003    (JP) ................................. 2003-101263

(51) Int. Cl.
C23C 16/00    (2006.01)
C23F 1/00    (2006.01)
H01L 21/306    (2006.01)
(52) U.S. Cl. .................................. 118/728; 156/345.51
(58) Field of Classification Search ............... 118/723 E, 118/728–730; 156/345.51–345.55; 204/298.01, 204/192.1
See application file for complete search history.

(56) References Cited

U.S. PATENT DOCUMENTS

| | | | | |
|---|---|---|---|---|
| 5,374,147 A | * | 12/1994 | Hiroki et al. | 414/217 |
| 5,738,729 A | * | 4/1998 | Dubs | 118/726 |
| 5,900,391 A | * | 5/1999 | Sakakibara et al. | 505/475 |
| 5,972,116 A | * | 10/1999 | Takagi | 118/719 |
| 6,146,504 A | * | 11/2000 | Patadia et al. | 204/192.12 |
| 6,237,529 B1 | * | 5/2001 | Spahn | 118/726 |
| 6,294,722 B1 | * | 9/2001 | Kondo et al. | 136/244 |
| 6,355,108 B1 | * | 3/2002 | Won et al. | 118/728 |
| 6,397,776 B1 | * | 6/2002 | Yang et al. | 118/723 MP |

(Continued)

FOREIGN PATENT DOCUMENTS

| | | |
|---|---|---|
| JP | 64-45760 U | 3/1989 |
| JP | 08-134653 A | 5/1996 |
| JP | 09-266240 A | 10/1997 |
| JP | 2000-001771 A | 1/2000 |

OTHER PUBLICATIONS

English translation of International Search Report for PCT/JP2004/004901, dated Jul. 20, 2004. Shigeo Kasahara, "2001 FPD Technology Outlook", Section 2, Electronic Journal, Oct. 25, 2000, pp. 598-600.

Primary Examiner — Parviz Hassanzadeh
Assistant Examiner — Tiffany Nuckols
(74) Attorney, Agent, or Firm — RatnerPrestia

(57) ABSTRACT

A method of manufacturing plasma display panels using a substrate holder for deposition on a substrate of the plasma display panel. The substrate holder is configured with plural frames, and the substrate of the plasma display panel is held by its periphery with at least one of these frames. A frame holding the substrate has a protrusion extending to a non-deposition face of the substrate held in such a way as to surround the substrate. Since the protrusion acts as a blocking sheet, attachment of a deposition material passing through an opening on the substrate holder and reaching onto the non-deposition face of the substrate is suppressed.

9 Claims, 6 Drawing Sheets

U.S. PATENT DOCUMENTS

| | | |
|---|---|---|
| 6,509,061 B1 * | 1/2003 | Ida et al. .................. 427/255.5 |
| 6,776,847 B2 * | 8/2004 | Yamazaki et al. ............ 118/724 |
| 6,919,569 B2 * | 7/2005 | Homme et al. ........ 250/370.11 |
| 2002/0011205 A1 * | 1/2002 | Yamazaki et al. ............ 118/620 |
| 2002/0132047 A1 * | 9/2002 | Yamazaki et al. ......... 427/255.6 |
| 2003/0200928 A1 * | 10/2003 | Tanaka et al. ................ 118/720 |
| 2004/0083976 A1 * | 5/2004 | Meyyappan ................. 118/728 |

* cited by examiner

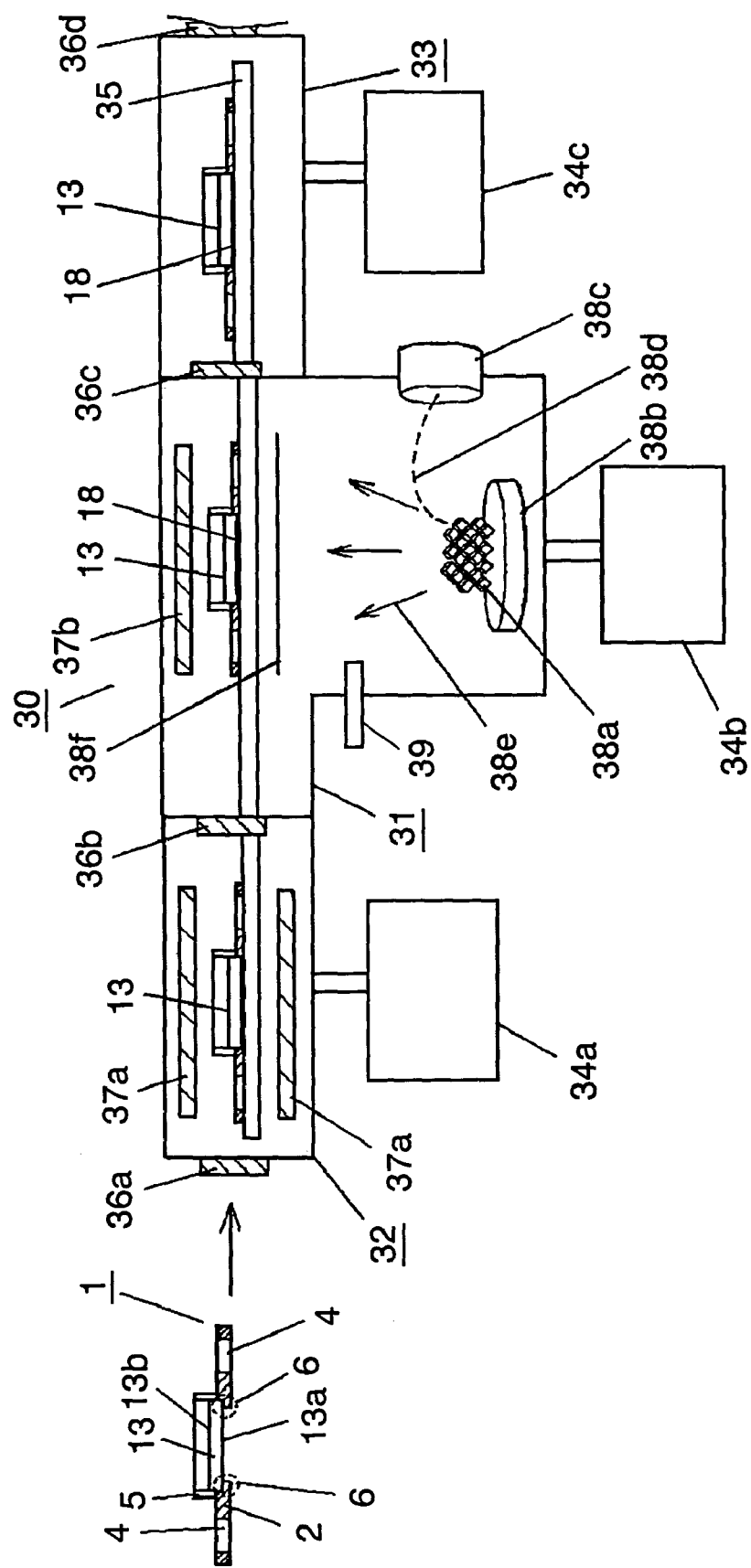

METHOD OF MANUFACTURING PLASMA DISPLAY PANELS

This Application is a U.S. National Phase Application of PCT International Application PCT/JP2004/004901.

TECHNICAL FIELD

The present invention relates to methods of manufacturing plasma display panels (PDPs), a thin and light display device with a large screen, and more particularly to deposition on a substrate of the plasma display panel. The present invention also relates to substrate holders of the plasma display panels used during deposition.

BACKGROUND ART

In the PDP manufacture, for example, an electrode is formed on a substrate at the image display side. Then, a dielectric layer covering the electrode and a magnesium oxide (MgO) film covering the dielectric layer as a protective layer are formed.

The electron-beam evaporation method is a widely used method for forming the protective layer, since it can form a relatively good quality MgO film at high deposition speeds (cf. "2001 FPD Technology Outlook", Electronic Journal, Oct. 25, 2000, pp 598-600).

With respect to deposition of the MgO film on the PDP substrate, the substrate is held with a substrate holder, and the substrate holder contacts or is connected to a transfer means such as roller, wire, or chain that transfers the substrate to inside the deposition equipment for consecutively depositing a film on more than one substrate.

However, since the film is deposited on the substrate while the substrate is held by the substrate holder, the film is also deposited on the substrate holder at area other than that holding the substrate. The film deposited on the substrate holder in this way thickens with repeated deposition. The thickened film then peels off into the deposition equipment, generating dust. If such dust is present inside the deposition equipment, the dust may become embedded in the film during deposition or mix with the film material, having a detrimental effect on the quality of the film being formed.

One example of a method for solving this problem is shown in FIG. 9. Substrate holder 1 is configured by aligning multiple frames 2, and substrate 3 of the plasma display panel is held with these frames 2 by its periphery. More specifically, if substrate holder 1 has the structure shown in FIG. 9, the only area other than that holding substrate 3 in substrate holder 1 is opening 4, and thus film cannot adhere to area other than that holding the substrate 3. FIG. 9 (*a*) is a plan view illustrating the schematic structure of substrate holder 1, and FIG. 9 (*b*) is a sectional view taken along A-A in FIG. 9 (*a*).

When the MgO film is deposited, the oxygen vacancy of MgO needs to be suppressed to assure the physical properties of the film as a protective layer. Accordingly, oxygen or gas containing oxygen is introduced during deposition.

In this case, the degree of vacuum during deposition is lower than that in general vapor deposition processes. This shortens the mean free path of the evaporated material (deposition material), which allows a proportion of the deposition material to pass through opening 4 of substrate holder 1 and travel to non-deposition face 3*b*, opposite deposition face 3*a* of substrate 3 being held, causing a certain quantity of film material to adhere to non-deposition face 3*b*. This creates areas in which the deposition material is laid down to different degrees, causing visually different states. Accordingly, there is a detrimental effect on the image display.

The present invention solves this problem, and aims to realize a method of manufacturing plasma display panels that can generate quality images by suppressing attachment of the deposition material to the non-deposition face of the substrate during deposition on the plasma display panel substrate.

DISCLOSURE OF INVENTION

To achieve the above object, one method of manufacturing plasma display panels of the present invention employs a substrate holder configured with multiple frames in methods of manufacturing plasma display panels using the substrate holder for holding the substrate for deposition. At least one of these frames holds the substrate by its periphery, and a protrusion protruding to a non-deposition face of the substrate held is provided on the frame holding the substrate in such a way as to surround the substrate.

Also, to achieve the above object, the substrate holder of the present invention for the plasma display panel has multiple frames in substrate holders for plasma display panels used for deposition on the substrate of the plasma display panel. At least one of these frames holds the substrate by its periphery, and a protrusion extending to the non-deposition face of the substrate held is provided on the frame holding the substrate in such a way as to surround the substrate.

BRIEF DESCRIPTION OF THE DRAWINGS

FIG. 2 is a sectional view of an example of a schematic structure of deposition equipment in accordance with the preferred embodiment of the present invention.

FIG. 3(*b*) is a sectional view taken along A-A in FIG. 3(*a*).

FIG. 9(*b*) is a sectional view taken along A-A in FIG. 9(*a*).

DETAILED DESCRIPTION OF PREFERRED EMBODIMENT(S)

A PDP manufacturing method in accordance with a preferred embodiment of the present invention is described below with reference to drawings.

Figure 1:
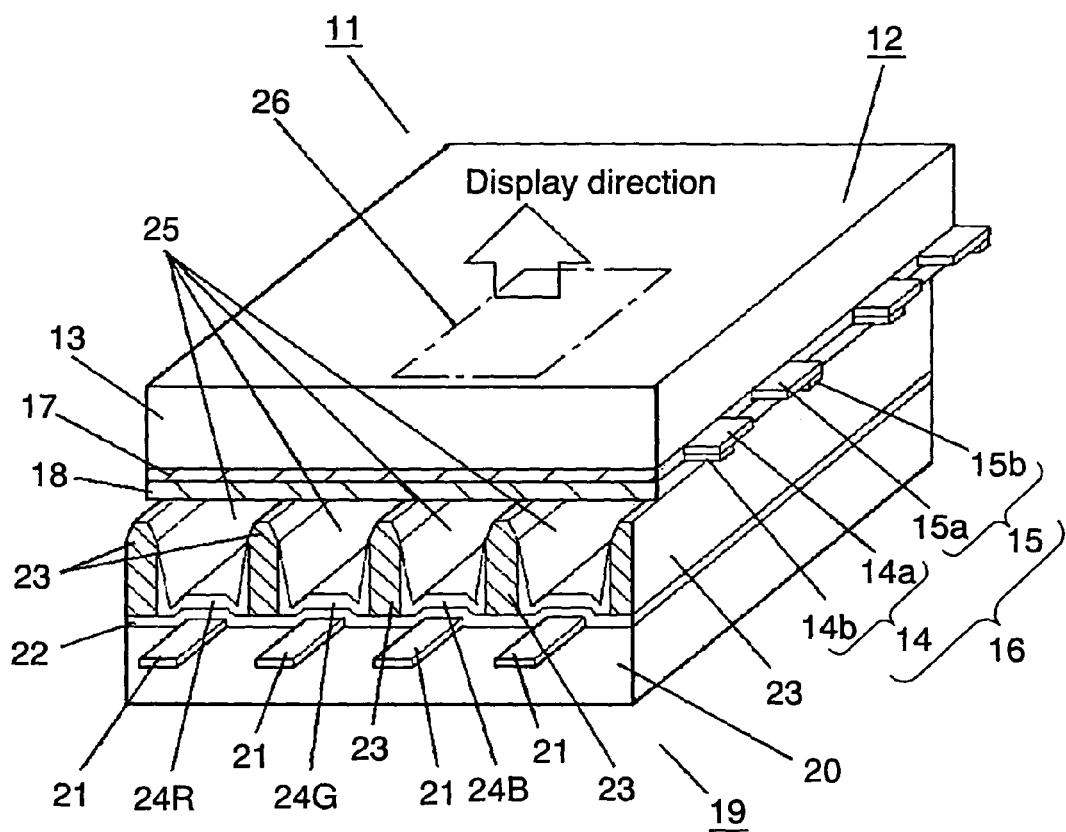
FIG. 1 is a sectional perspective view of an example of a schematic structure of a plasma display panel in accordance with a preferred embodiment of the present invention.

First, an example of a PDP structure is described. FIG. 1 is a sectional perspective view illustrating a schematic structure of the PDP made using the PDP manufacturing method in the preferred embodiment of the present invention.

Front board 12 of PDP 11 has scanning display electrode 16, consisting of scan electrode 14 and sustain electrode 15; dielectric layer 17 covering this display electrode 16; and protective layer 18, typically made of MgO, further covering dielectric layer 17, on one main face at the front side of transparent insulating substrate 13, typically made of glass. Scan electrode 14 and sustain electrode 15 are configured by laminating bus electrodes 14b and 15b, made of a metal such as Ag, on transparent electrodes 14a and 15a so as to reduce electrical resistance.

Rear plate 19 at the back side has address electrode 21; dielectric layer 22 covering this address electrode 21; barrier rib 23 disposed on this dielectric layer 22 between adjacent address electrodes 21; and phosphor layers 24R, 24G and 24B, which emit red (R), green (G) and blue (B) light, on one main face of insulating substrate 20, typically made of glass.

Front board 12 and rear plate 19 face each other with barrier rib 23 in between in a direction that displays electrode 16 and address electrode 21 cross orthogonally. The periphery outside image display area is sealed with a sealing member. Discharge gas, typically of Ne—Xe system or He—Xe system, is injected into discharge space 25 created between front board 12 and rear plate 19 at a pressure of about 66.5 kPa.

Portions where display electrode 16 and address electrode 21 cross in discharge space 25 act as discharge cells 26 (unit light-emitting area).

Next, the method of manufacturing the above PDP 11 is described with reference to also FIG. 1.

With respect to front board 12, scan electrode 14 and sustain electrode 15 are first formed in stripes on substrate 13. More specifically, a material for transparent electrodes 14a and 15a, typically an indium tin oxide (ITO) film, is formed on substrate 13 through a deposition process such as vapor deposition or sputtering. Then, transparent electrodes 14a and 15a are striped by patterning, typically using photolithography. A material for bus electrodes 14b and 15b, typically Ag, is then formed on transparent electrodes 14a and 15a through a deposition process such as by vapor deposition or sputtering. Finally, bus electrodes 14b and 15b are striped by patterning, typically using photolithography. This completes display electrode 16, consisting of stripes of scan electrodes 14 and sustain electrodes 15.

Next, display electrode 16, formed as described above, is covered with dielectric layer 17. Dielectric layer 17, made of paste containing lead glass, is applied such as by screen printing, and then fired to achieve a predetermined layer thickness (about 20 μm to 50 μm, preferably about 40 μm). Paste containing the aforementioned lead glass is, for example, a mixture of PbO, $B_2O_3$, $SiO_2$ and CaO and an organic binder (such as ethyl cellulose dissolved in α-terpineol). The organic binder is resin dissolved in organic solvent, and thus acrylic resin can also be used as the resin instead of ethyl cellulose and butyl carbitol can be used as the organic solvent. A dispersing agent such as glyceryl trioleate can also be mixed in the organic binder.

Next, dielectric layer 17 formed as described above is covered with protective layer 18. Protective layer 18 is typically made of MgO and formed into a predetermined layer thickness (about 0.4 μm to 1 μm, preferably about 0.6 μm) through a deposition process such as vapor deposition or sputtering.

With respect to rear plate 19, address electrode 21 is striped on substrate 20. More specifically, a material for address electrode 21, such as a film made of Ag, is formed on substrate 20 through a deposition process such as vapor deposition and sputtering, after which the film is patterned, typically using photolithography, to form striped address electrode 21.

Address electrode 21 formed as described above is then covered with dielectric layer 22. Dielectric layer 22 made of paste typically containing lead glass is applied, typically by screen printing, and then fired to achieve a predetermined thickness (about 10 μm to 50 μm, preferably about 10 μm).

Barrier rib 23 is then formed, such as in stripes. Barrier rib 23 is made of paste typically containing lead glass, the same as dielectric layer 22, repeatedly applied at a predetermined pitch, typically by screen printing, and then fired. An interval between barrier ribs 23 is, for example, about 130 μm to 360 μm for 32" to 65" screen sizes.

Phosphor layers 24R, 24G and 24B respectively configured with phosphor particles producing red (R) green (G) and blue (B) are formed in the grooves between barrier ribs 23. Phosphor ink paste made of phosphor particles of each color and organic binder is applied and then fired to bind phosphor particles by burning out the organic binder to form phosphor layers 24R, 24G and 24B.

Front board 12 and rear plate 19 manufactured as above are overlaid in such a way that display electrode 16 on front board 12 and address electrode 21 on rear plate 19 cross orthogonally. A sealing member made of sealing glass is filled around the periphery, and an airtight sealing layer (not illustrated) is formed for sealing by firing the sealing member at a temperature lower than the firing temperature of dielectric layer 17. After evacuating air in discharge space 25 to achieve a high vacuum, He—Xe system or Ne—Xe system discharge gas, for example, is injected at a predetermined pressure to complete PDP 11.

As described above, the deposition process is often applied in the manufacture of PDP 11. Therefore, the deposition process is detailed with reference to drawings, using the formation of protective layer 18 by evaporating MgO as an example.

First, an example of the structure of the deposition equipment is described. FIG. 2 is a sectional view illustrating an example of a schematic structure of deposition equipment 30 for forming protective layer 18.

This deposition equipment 30 includes vapor deposition chamber 31, substrate loading chamber 32, and substrate unloading chamber 33. Vapor deposition chamber 31 is for forming protective layer 18, a thin MgO film, by evaporating MgO. Substrate loading chamber 32 is for preheating substrate 13 and applying preliminary evacuation before feeding substrate 13 to MgO vapor deposition chamber 31. Substrate unloading chamber 33 is for cooling substrate 13 taken out from vapor deposition chamber 31 after vapor deposition.

Each of the above substrate loading chamber 32, vapor deposition chamber 31 and substrate unloading chamber 33 has a sealed structure so as to maintain an internal vacuum. Each chamber is equipped with independent evacuation systems 34a, 34b and 34c respectively.

Transfer means 35, configured with roller, wire, chains, etc. is provided through substrate loading chamber 32, vapor deposition chamber 31 and substrate loading chamber 33. In addition, openable partitions 36a, 36b, 36c and 36d divide between the outside of deposition equipment 30 and substrate loading chamber 32, between substrate loading chamber 32 and vapor deposition chamber 31, between vapor deposition chamber 31 and substrate unloading chamber 33 and between substrate unloading chamber 33 and outside of deposition equipment 30. Fluctuation in degree of vacuum in substrate loading chamber 32, vapor deposition chamber 31 and substrate unloading chamber 33 is minimized by interlocking driving of transfer means 35 and opening/closing of partitions 36a, 36b, 36c and 36d. Substrate 13 passes through from outside deposition equipment 30 in the sequence of substrate loading chamber 32, vapor deposition chamber 31 and substrate unloading chamber 33. After a predetermined processing in each chamber, substrate 13 can be removed from deposition equipment 30. The above operations allow continuous deposition of MgO film by loading plural substrates 13 consecutively.

Moreover, heating lamps 37a and 37b for heating substrate 13 are provided respectively in substrate loading chamber 32 and vapor deposition chamber 31.

Vapor deposition chamber 31 includes hearth 38b containing MgO grains which are vapor deposition source 38a, electron gun 38c and a deflection magnet (not illustrated) for applying a magnetic field. Electron beam 38d emitted from electron gun 38c is deflected by the magnetic field generated by the deflection magnet, and electron beam 38d is radiated to vapor deposition source 38a so as to generate vapor flow 38e of MgO which is vapor deposition source 38a. Generated vapor flow 38e is deposited on the surface of substrate 13 to form MgO protective layer 18. Lead-in means 39 for introducing oxygen or gas containing oxygen is provided in vapor deposition chamber 31 for creating an oxygen-containing atmosphere in vapor deposition chamber 31 during deposition to ensure good quality deposition of MgO. Since oxygen or gas containing oxygen is introduced during vapor deposition, the degree of vacuum inside vapor deposition chamber 31 during deposition is lower than in other commonly used vapor deposition processes. In addition, vapor flow 38e can be cut off by shutter 38f when not necessary.

Other than the above structure for deposition equipment 30, one or more substrate heating chambers for heating substrate 13 can be provided between substrate loading chamber 32 and vapor deposition chamber 31; alternatively, one or more substrate cooling chambers can be provided between vapor deposition chamber 31 and substrate unloading chamber 33 based on temperature profile setting of substrate 13.

In deposition equipment 30 described above, substrate 13 is transferred by holding substrate 13 with substrate holder 1 and making substrate holder 1 contact with or connect to transfer means 35 of deposition equipment 30.

Next, substrate holder 1 in the preferred embodiment of the present invention is described with reference to FIG. 3.

Figure 3A:
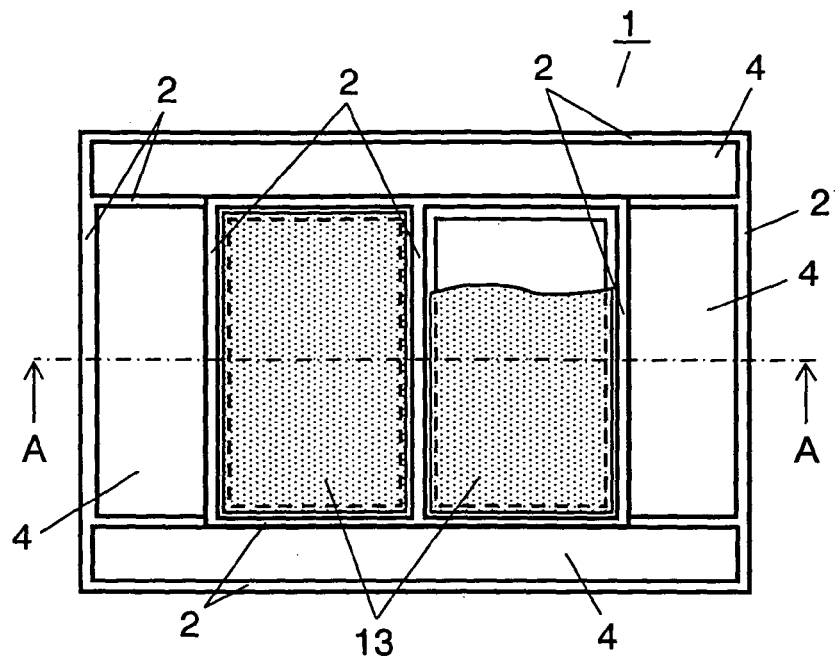
FIG. 3(*a*) is a plan view of a schematic structure of a substrate holder in accordance with the preferred embodiment of the present invention.
Figure 3B:
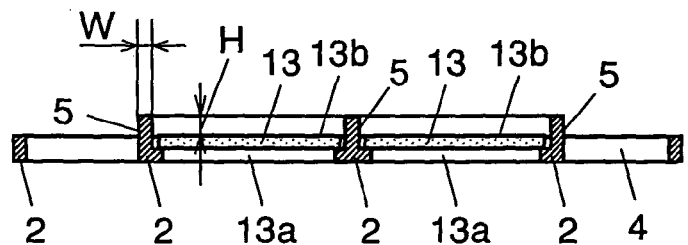

FIG. 3 (a) is a plan view of a schematic structure of substrate holder 1, and FIG. 3 (b) is a sectional view taken along A-A in FIG. 3 (a).

As shown in FIG. 3, multiple frames 2 are arranged in substrate holder 1. The periphery of substrate 13 of the plasma display panel is held with at least one of these frames 2. Frame 2 holding substrate 13 is provided with protrusion 5 surrounding substrate 13. This protrusion 5 extends to non-deposition face 13b opposite deposition face 13a of substrate 13 held. Other frames 2 not holding substrate 13 become opening 4.

Since substrate holder 1 has a structure with opening 4 as described above, vapor flow 38e traveling to areas other than substrate 13 from hearth 38b of deposition equipment 30 in FIG. 2 passes through opening 4, and thus vapor flow 38e is not deposited on substrate holder 1. This results in the suppression of dust generation inside deposition equipment 30 as a result of the deposition material attaching to, depositing on, and then peeling from substrate holder 1.

As described previously, a relatively shorter mean free path due to lower degree of vacuum compared to other general vapor deposition processes results in loosing linearity of deposition material flying in the chamber. Accordingly, a proportion of the deposition material passing through opening 4 of substrate holder 1 reaches and deposits on non-deposition face 13b of substrate 13. However, protrusion 5, provided on frame 2 holding substrate 13, extending to non-deposition face 13b of substrate 13 held and surrounding substrate 13 suppresses this phenomenon. This is achieved by the effect in which protrusion 5 blocks the deposition material from reaching around. To achieve an efficient blocking effect, height H of protrusion 5 is preferably 1 mm or more from non-deposition face 13b of substrate 13. With consideration to actual operability and deposition equipment 30 shown in FIG. 2, conditions such as the degree of vacuum in the deposition process are stabilized by reducing the space over transfer means 35 as much as possible. From this viewpoint, protrusion 5 is preferably 100 mm or shorter. When height H is about 1 mm, width W (FIG. 3) is preferably 10 mm or more. Greater height H allows smaller width W.

Figure 4:
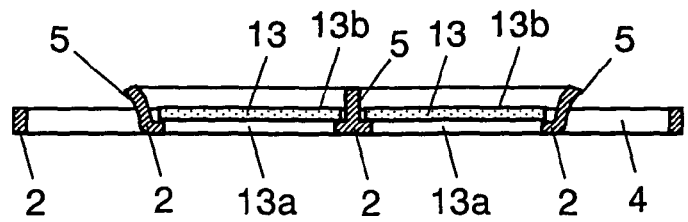
FIG. 4 is a sectional view of a schematic structure of another substrate holder in accordance with the preferred embodiment of the present invention.
Figure 5:
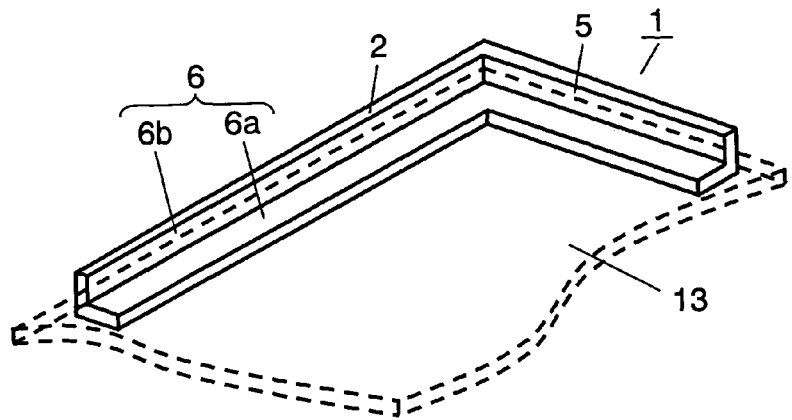
FIG. 5 is a partial magnified perspective view of a schematic structure of another substrate holder in accordance with the preferred embodiment of the present invention.

With respect to protrusion 5, any shape, such as the curved shape shown in FIG. 4 other than the straight protrusion shown in FIG. 3 is applicable as long as it can block the deposition material passing through opening 4.

With respect to further arrangements of frames 2, a variety of structures, including an integrated structure made by cutting and making holes on a board other than combining multiple frames 2, are usable.

Some of the structures for which frame 2 acts as holding means 6 for holding substrate 13 are shown in FIGS. 5 to 8, which are magnified views of a part of substrate holder 1. Holding means 6, shown in FIG. 5, features an L-shape or reversed T-shaped section for frame 2. The horizontal side of frame 2 supports substrate 13 from underneath as support 6a, and the vertical side acts as positioner 6b for positioning substrate 13 in the planar direction. Substrate 13 is thus held by fitting substrate 13 to positioner 6b and placing it on support 6a. In other words, positioner 6b, which is the vertical side of frame 2, also acts as protrusion 5 in this case.

Figure 6:
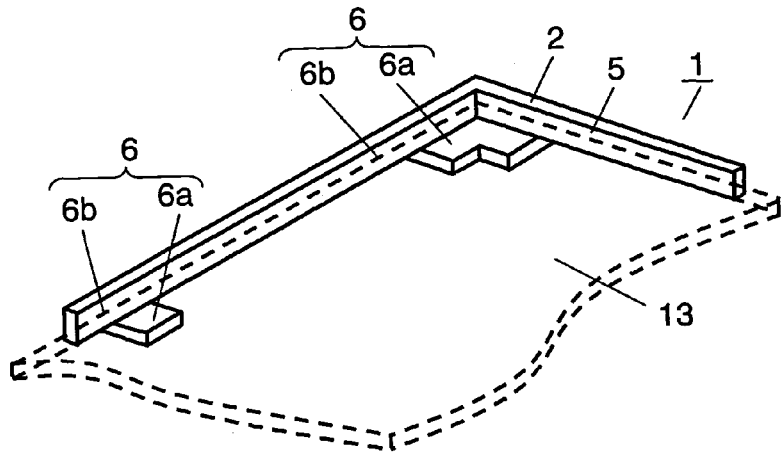
FIG. 6 is a partial magnified perspective view of a schematic structure of another substrate holder in accordance with the preferred embodiment of the present invention.

In the structure of holding means 6 of substrate holder 1 shown in FIG. 6, frame 2 only has a vertical side. This frame 2 acts as positioner 6b for positioning substrate 13 in the planar direction. In addition, support 6a for supporting substrate 13 from underneath is provided on the bottom face of frame 2. Substrate 13 is thus held by fitting substrate 13 to positioner 6b and placing it on support 6a. In this case, frame 2 has a structure that acts as positioner 6b and protrusion 5.

Figure 7:
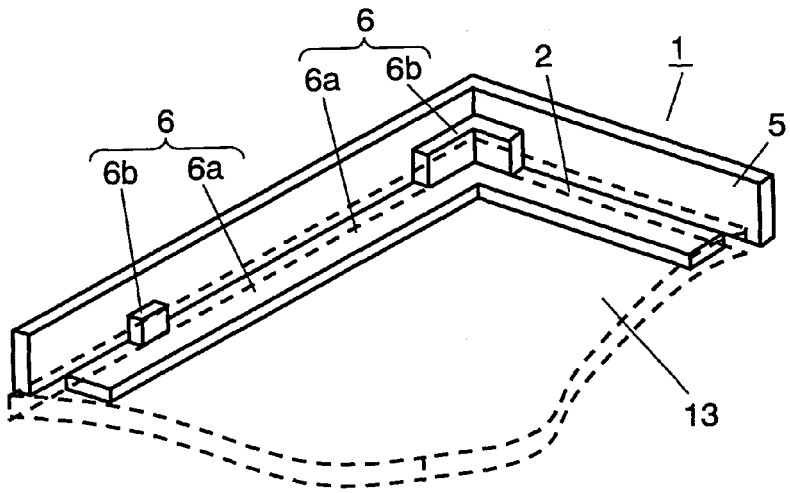
FIG. 7 is a partial magnified perspective view of a schematic structure of another substrate holder in accordance with the preferred embodiment of the present invention.

In the structure of holding means 6 shown in FIG. 7, frame 2 only has the horizontal side. This frame 2 acts as support 6a for supporting substrate 13 from underneath. Positioner 6b for positioning substrate 13 in the planar direction is provided on the upper face of frame 2. Substrate 13 is thus held by fitting substrate 13 to positioner 6b and placing it on support 6a. In this structure, protrusion 5 surrounding substrate 13 is provided separately from positioner 6b because positioner 6b is only partially placed.

Figure 8:
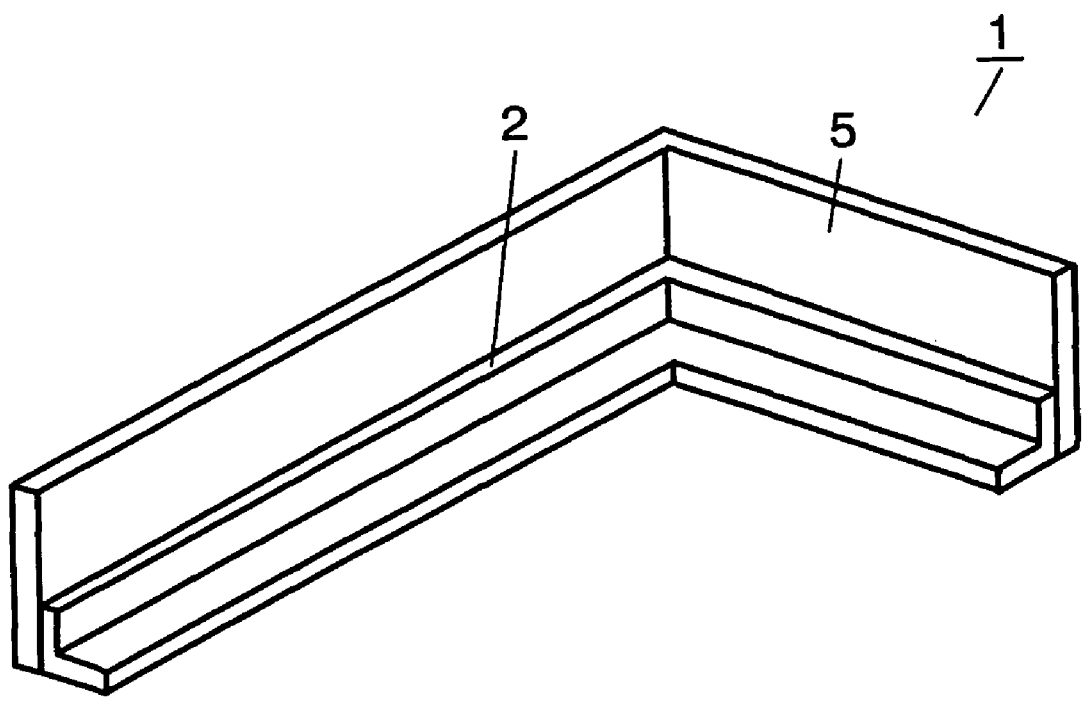
FIG. 8 is a partial magnified perspective view of a schematic structure of another substrate holder in accordance with the preferred embodiment of the present invention.
Figure 9A:
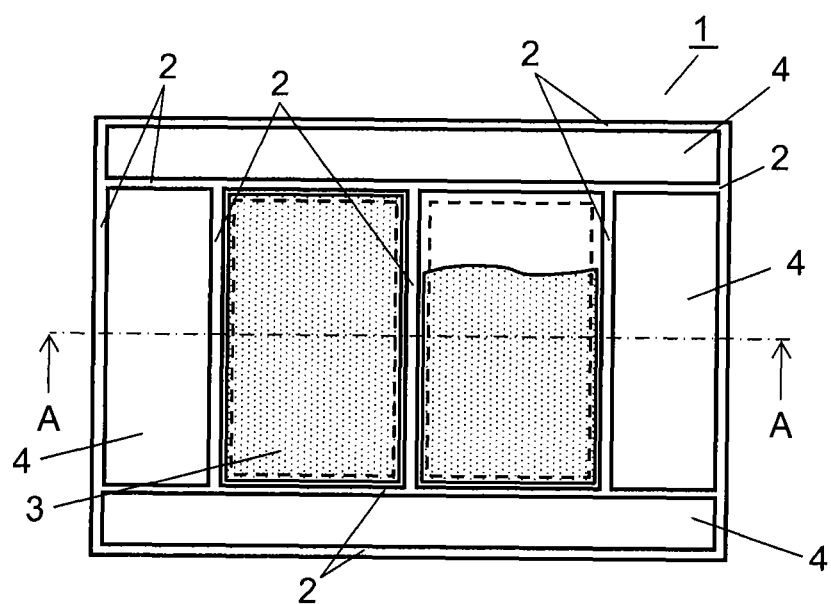
FIG. 9(*a*) is a plan view illustrating the schematic structure of a conventional substrate holder.
Figure 9B:
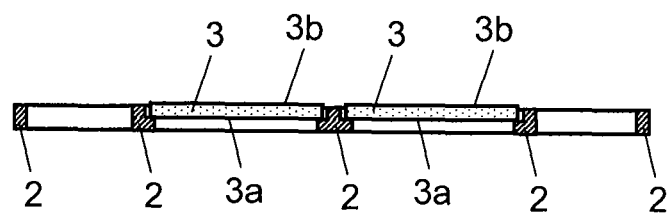

Moreover, protrusion 5 can be provided separately from substrate holder 1. For example, as shown in FIG. 8, protrusion 5 can be attached to frame 2 of substrate holder 1 separately by other means.

As long as holding means 6 has the structure described above, substrate 13 can be held by placing substrate 13 on support 6a of holding means 6 provided on frame 2. Accordingly, attachment and detachment of substrate 13 to substrate holder 1 can be achieved by just raising frame 2, significantly simplifying the operation.

Next, an example of the deposition process including holding of substrate 13 by substrate holder 1 and transfer of substrate 13 inside deposition equipment 30 by transfer means 31 is described with reference to FIGS. 1 to 3.

First, substrate 13, held by substrate holder 1 as shown in FIG. 3, is placed in substrate loading chamber 32 of deposition equipment 30, as shown in FIG. 2. Substrate 13 is heated by heating lamp 37a during preliminary evacuation by vacuum system 34a. At this point, display electrode 16 and dielectric layer 17 are formed on substrate 13.

When the inside of substrate loading chamber 32 reaches a predetermined degree of vacuum, partition 36b is opened, and heated substrate 13 is transferred, held by substrate holder 1, to vapor deposition chamber 3 using transfer means 35.

In vapor deposition chamber 31, substrate 13 is heated by heating lamp 37b and maintained at a predetermined temperature. This temperature is set between about 100° C. and 400° C. so that display electrode 16 and dielectric layer 17 do not thermally degrade. Then, electron beam 38d from electron gun 38c is radiated at vapor deposition source 38a for pre-heating while shutter 38f is closed so as to degas to a predetermined degree. Oxygen or gas containing oxygen is then introduced by lead-in means 39. Due to this introduction of gas, the degree of vacuum during deposition becomes lower than that used in general deposition processes. When shutter 38f is opened under these conditions, MgO vapor flow 38e is injected toward substrate 13 held by substrate holder 1. As a result, deposition material traveling to substrate 13 forms protective layer 18 made of MgO film on substrate 13.

Since substrate holder 1 has the structure shown in FIG. 3, the deposition material traveling in areas other than substrate 13 passes through opening 4 of substrate holder 1, significantly suppressing attachment of deposition material to substrate holder 1.

Frame 2 holding substrate 13 has protrusion 5 extending to non-deposition face 13b on the opposite side of deposition face 13a of substrate 13 held and surrounding substrate 13. Protrusion 5 acts as a block against the deposition material passing through opening 4 of substrate holder 1. Accordingly, deposition material reaching and attaching to non-deposition face 13b of substrate 13 is suppressed.

When protective layer 18, the MgO deposition film, formed on substrate 13 reaches a predetermined thickness (about 0.4 μm to 1 μm, preferably 0.6 μm), shutter 38f closes and substrate 13 is transferred to substrate unloading chamber 33 through partition 36c. Transfer means 35 is configured to contact or connect just by both ends of substrate holder 1 during transfer. Accordingly, no quality problems on protective layer 18, the deposited film, occur on substrate 13 by the effect of transfer means 35 during vapor deposition in vapor deposition chamber 31.

After cooling down substrate 13 to a predetermined temperature in substrate unloading chamber 33, substrate 13 is taken out from holding means 6 of frame 2 of substrate holder 1. In this preferred embodiment, substrate 13 is supported by simply placing it on support 6a provided on frame 2. Accordingly, substrate 13 can be taken out just by raising substrate 13 from frame 2. This significantly simplifies the process.

Substrate holder 1, after removing deposited substrate 13, holds next substrate 13 without deposition, and is again placed inside deposition equipment 30.

In the above description, MgO can be deposited on substrate 13 in vapor deposition chamber 31 in a stationary state by stopping transfer or during transfer.

The effect of the present invention is also achievable with other types of deposition equipment 30: for example, deposition equipment with a buffer space between chambers for adjusting tact time, those with a chamber for heating or cooling, or those adopting a batch system for substrate holder 30 in the deposition chamber. Even if the deposition equipment is configured with a batch-type substrate holder 1 in the chamber, the same effect is achievable by adopting the aforementioned structure for substrate holder 1 holding substrate 13.

The above preferred embodiment refers to the formation of MgO protective layer 18. However, the effect of the present invention is also achievable with other types of deposition using the substrate holder 1 for holding substrate 13, including formation of display electrodes 16 and deposition of ITO and silver material.

In the above description, electron beam evaporation is used for deposition. It is apparent that the same effect is achievable with deposition under reduced pressure other than electron beam evaporation, including hollow cathode discharge deposition, ion plating and sputtering.

INDUSTRIAL APPLICABILITY

The present invention suppresses the attachment of deposition material on the non-deposition face of a plasma display panel substrate. This is effective as a method of manufacturing plasma display panels known as a thin and light display device with a large screen.

REFERENCE MARKS IN THE DRAWINGS

1 Substrate holder
2 Frame
4 Opening
5 Protrusion
13 Substrate
13a Deposition face
13b Non-deposition face

The invention claimed is:
1. A method of manufacturing a plasma display panel, the method comprising the steps of:
providing a substrate holder above a source of deposition material, the substrate holder including:
a plurality of first frames for holding a plurality of substrates for a respective plurality of plasma display panels, said plurality of first frames have an inner protrusion between them which extends from below a bottom surface of the substrate along a side surface of the substrate to a height above the substrate and greater than a height of the substrate without being superimposed over the top surface of the substrate, said inner protrusion extending in a straight direction; and
a plurality of second frames each having a respective opening, curved outer protrusions situated between each of the second frames and the plurality of first frames so that the substrates are on one side of each of the curved outer protrusions and each respective opening is on another side of each of the curved outer protrusions, the protrusions also extending above the substrates without being superimposed over the tops of the substrates, and an unobstructed path exists from said source of deposition material to a top surface of said substrate;
providing the plasma display panel which is held by the substrate holder for deposition;
spraying said deposition material onto said bottom surface of said substrate from below the substrate;
and permitting an additional amount of said deposition material to flow through said opening from below the substrate.

2. The method of manufacturing a plasma display panel as defined in claim 1, wherein heights of the protrusion and the protrusions are between 1 mm and 100 mm.

3. The method of manufacturing a plasma display panel as defined in claim 1, the first frame comprising holding means including support means for supporting the plurality of substrates from underneath and positioning means for positioning the plurality of substrates in a planar direction, wherein the plurality of substrates are held by fitting the plurality of substrates to the positioning means and placing the plurality of substrates on the support means.

4. A substrate holder system for a plasma display panel, the substrate holder system comprising:
   a plurality of first frames for holding a plurality of substrates for a respective plurality of plasma display panels, said plurality of first frames being provided with an inner protrusion between them which extends from below a bottom surface of the substrate along a side surface of the substrate to a height above the substrate greater than a height of the substrate without being superimposed over the top surface of the substrate, said inner protrusion extending in a straight direction,
   a plurality of second frames each having a respective opening, curved outer protrusions situated between each of the second frames and the plurality of first frames so that the substrates are on one side of each of the curved outer protrusions and each respective opening is on another side of each of the curved outer protrusions, the curved outer protrusions also extending above the substrates without being superimposed over the tops of the substrates;
   and a source of deposition material below said substrate which sprays said deposition material towards the bottom surface of the substrate and through the opening;
   wherein an unobstructed path exists from said source of deposition material to a top surface of said substrate.

5. A method of manufacturing a plasma display panel as defined in claim 1, wherein the curved outer protrusions curve away from the plurality of substrates.

6. The substrate holder system for a plasma display panel as defined in claim 4, wherein heights of the protrusion and the protrusions are between 1 mm and 100 mm.

7. The substrate holder system for a plasma display panel as defined in claim 4, the first frame comprising holding means including support means for supporting the plurality of substrates from underneath and positioning means for positioning the plurality of substrates in a planar direction, wherein the plurality of substrates are held by fitting the plurality of substrates to the positioning means and placing the plurality of substrates on the support means.

8. The substrate holder system for a plasma display panel as defined in claim 4, wherein the first frame includes a plurality of supports separated from each other which extend below the bottom surface of the plurality of substrates.

9. The substrate holder system for a plasma display panel as defined in claim 4, said second frame maintained with said opening while the plurality of substrates are situated in said first frame.

* * * * *